(12) United States Patent
Cohen et al.

(10) Patent No.: US 8,716,695 B2
(45) Date of Patent: May 6, 2014

(54) COMPRESSIVE (PFET) AND TENSILE (NFET) CHANNEL STRAIN IN NANOWIRE FETS FABRICATED WITH A REPLACEMENT GATE PROCESS

(71) Applicant: International Business Machines Corporation, Armonk, NY (US)

(72) Inventors: Guy Cohen, Mohegan Lake, NY (US); Michael A. Guillorn, Yorktown Heights, NY (US); Conal E. Murray, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/923,530

(22) Filed: Jun. 21, 2013

(65) Prior Publication Data

US 2013/0285020 A1 Oct. 31, 2013

Related U.S. Application Data

(62) Division of application No. 13/344,352, filed on Jan. 5, 2012, now Pat. No. 8,492,208.

(51) Int. Cl.
*H01L 29/06* (2006.01)

(52) U.S. Cl.
USPC ........ 257/27; 257/24; 257/288; 257/E29.081; 257/E21.703; 438/151; 438/197; 438/201; 977/721; 977/762

(58) Field of Classification Search
USPC .............. 257/24, 288, E29.081, E21.703, 27; 438/151, 197, 201; 977/721, 762–766
See application file for complete search history.

(56) References Cited

U.S. PATENT DOCUMENTS

| 5,250,454 | A | 10/1993 | Maszara |
| 6,897,098 | B2 | 5/2005 | Hareland et al. |
| 7,101,761 | B2 | 9/2006 | Chau et al. |
| 7,193,254 | B2 | 3/2007 | Chan et al. |
| 7,534,675 | B2 | 5/2009 | Bangsaruntip et al. |

(Continued)

FOREIGN PATENT DOCUMENTS

| WO | WO2008030960 A2 | 3/2008 |
| WO | WO2012066444 A1 | 5/2012 |

OTHER PUBLICATIONS

James M. Gere, Mechanics of Materials, 6th Ed., pp. 24-25 (2004).

(Continued)

*Primary Examiner* — Marvin Payen
*Assistant Examiner* — Victor Barzykin
(74) *Attorney, Agent, or Firm* — Vazken Alexanian; Michael J. Chang, LLC (57) ABSTRACT

A method of fabricating a FET device is provided which includes the following steps. Nanowires/pads are formed in a SOI layer over a BOX layer, wherein the nanowires are suspended over the BOX. A HSQ layer is deposited that surrounds the nanowires. A portion(s) of the HSQ layer that surround the nanowires are cross-linked, wherein the cross-linking causes the portion(s) of the HSQ layer to shrink thereby inducing strain in the nanowires. One or more gates are formed that retain the strain induced in the nanowires. A FET device is also provided wherein each of the nanowires has a first region(s) that is deformed such that a lattice constant in the first region(s) is less than a relaxed lattice constant of the nanowires and a second region(s) that is deformed such that a lattice constant in the second region(s) is greater than the relaxed lattice constant of the nanowires.

11 Claims, 5 Drawing Sheets

(56) References Cited

U.S. PATENT DOCUMENTS

| | | |
|---|---|---|
| 7,554,621 B2 | 6/2009 | Mori |
| 7,629,603 B2 | 12/2009 | Chui et al. |
| 7,884,004 B2 | 2/2011 | Bangsaruntip et al. |
| 7,902,541 B2 | 3/2011 | Sekaric et al. |
| 7,989,233 B2 | 8/2011 | Sekaric et al. |
| 2009/0146194 A1 | 6/2009 | Moselund et al. |
| 2009/0242990 A1 | 10/2009 | Saitoh et al. |
| 2010/0183853 A1 | 7/2010 | Ihara |
| 2010/0252801 A1 | 10/2010 | Sekaric et al. |
| 2011/0012176 A1 | 1/2011 | Chidambarrao et al. |
| 2011/0095267 A1* | 4/2011 | Bryant et al. ............ 257/24 |
| 2011/0207335 A1 | 8/2011 | Barwicz |
| 2011/0233522 A1* | 9/2011 | Cohen et al. ............ 257/24 |
| 2012/0007051 A1 | 1/2012 | Bangsaruntip et al. |
| 2012/0280211 A1 | 11/2012 | Cohen et al. |

OTHER PUBLICATIONS

Hashemi et al., "Fabrication and Characterization of Suspended Uniaxial Tensile Strained-Si Nanowires for Gate-All-Around n-MOSFETs," ECS Transactions, vol. 16, No. 10, pp. 57-68 (Oct. 2008).

Hashemi et al., "Electron Transport in Gate-All-Around Uniaxial Tensile Strained-Si Nanowire n-MOSFETs," IEEE International Electron Devices Meeting, IEDM, Dec. 15-17, 2008, 4 pages.

Jeong et al., "Uniaxial Strain Effects on Silicon Nanowire pMOSFET and Single-Hole Transistor at Room Temperature," IEEE International Electron Devices Meeting, IEDM, Dec. 15-17, 2008, 4 pages.

Yang et al., "Enhancing etch resistance of hydrogen silsesquioxane via postdevelop electron curing," J. Vac. Sci. Technol. B 24, pp. 3157-3161, Nov./Dec. 2006.

Yang et al., "Using high-contrast salty development of hydrogen silsesquioxane for sub-10 nm half-pitch lithography," J. Vac. Sci. Technol. B 25, 2025 (Nov./Dec. 2007).

Choi et al., "Comparative Study of thermally cured and electron-beam-exposed hydrogen silsesquioxane resists," J. Vac. Sci. Technol. B 26, pp. 1654-1659 (Sep. 2008).

\* cited by examiner

FIG. 3
(COMPRESSIVE CHANNEL)

OPTIONAL: USING EPITAXIAL FILM EARLIER IN PROCESS TO INDUCE ADDITIONAL STRAIN IN THE NANOWIRES

FIG. 4

OPTIONAL: USING EPITAXIAL FILM EARLIER IN PROCESS TO INDUCE ADDITIONAL STRAIN IN THE NANOWIRES

ORGANIC PLANARIZING MATERIAL
FILLS UNDER THE NANOWIRES

FIG. 7A
(BEFORE CROSS LINKING HSQ AND OPTIONAL ANNEALING)

FIG. 7B
(AFTER CROSS LINKING HSQ AND OPTIONAL ANNEALING)

COMPRESSIVE (PFET) AND TENSILE (NFET) CHANNEL STRAIN IN NANOWIRE FETS FABRICATED WITH A REPLACEMENT GATE PROCESS

CROSS-REFERENCE TO RELATED APPLICATIONS

This application is a divisional of U.S. application Ser. No. 13/344,352 filed on Jan. 5, 2012, now U.S. Pat. No. 8,492,208, the contents of which are incorporated herein by reference as fully set forth herein.

FIELD OF THE INVENTION

The present invention relates to semiconductor-based electronic devices, and more particularly, to field-effect transistor (FET) devices having nanowire channels and techniques for fabrication thereof.

BACKGROUND OF THE INVENTION

With nanowire-based field effect transistors (FETs), the nanowires serve as channels of the device interconnecting a source region and a drain region. A gate surrounding the nanowire regulates electron flow through the channels. When the gate completely surrounds a portion of each of the nanowire channels, this configuration is referred to as a gate-all-around (GAA) device. GAA nanowire-based FETs have excellent scaling properties and are presently investigated as building blocks for future complementary metal-oxide semiconductor (CMOS) technology.

Process-induced channel strain is presently used to enhance device performance. Namely, compressive strain is used with p-channel FETs (PFETs) to improve the hole mobility and tensile strain is used with n-channel FETs (NFETs) to improve the electron mobility. While the techniques for inducing channel strain in planar CMOS devices are relatively straightforward, this is not the case with nanowire-based devices. Applying channel strain in the case of nanowire FETs is challenging.

Therefore, process-induced channel strain techniques for GAA nanowire-based FETs would be desirable.

SUMMARY OF THE INVENTION

The present invention provides field-effect transistor (FET) devices having nanowire channels and techniques for fabrication thereof In one aspect of the invention, a method of fabricating a FET device is provided. The method includes the following steps. Nanowires and pads are formed in a silicon-on-insulator (SOI) layer over a buried oxide (BOX) layer, wherein the nanowires are connected to the pads in a ladder-like configuration, and wherein the nanowires are suspended over the BOX. A hydrogen silsesquioxane (HSQ) layer is deposited that surrounds the nanowires. One or more portions of the HSQ layer that surround the nanowires are cross-linked, wherein the cross-linking causes the one or more portions of the HSQ layer to shrink thereby inducing strain in the nanowires. One or more gates surrounding portions of each of the nanowires are formed, wherein the gates retain the strain induced in the nanowires by the cross-linking step, and wherein the portions of the nanowires surrounded by the gates comprise channel regions of the device and portions of the nanowires extending out from the gates and the pads comprise source and drain regions of the device.

In another aspect of the invention, a FET device is provided. The FET device includes nanowires and pads formed in a SOI layer over a BOX layer, wherein the nanowires are connected to the pads in a ladder-like configuration, and wherein the nanowires are suspended over the BOX; one or more gates surrounding portions of each of the nanowires, wherein the portions of the nanowires surrounded by the gates comprise channel regions of the device and portions of the nanowires extending out from the gates and the pads comprise source and drain regions of the device; wherein each of the nanowires has 1) at least one first region that is deformed such that a lattice constant in the at least one first region is less than a relaxed lattice constant of the nanowires and 2) at least one second region that is deformed such that a lattice constant in the at least one second region is greater than the relaxed lattice constant of the nanowires, and wherein the one or more gates surround either the at least one first region or the at least one second region of each of the nanowires. A more complete understanding of the present invention, as well as further features and advantages of the present invention, will be obtained by reference to the following detailed description and drawings.

DETAILED DESCRIPTION OF PREFERRED EMBODIMENTS

The present teachings related to processes for fabricating gate-all-around (GAA) nanowire-based field-effect transistors (FETs) having process-induced channel strain. In this discussion, reference will be made to various drawings that illustrate embodiments of the present teachings. Since the drawings of the embodiments of the present teachings are provided for illustrative purposes, the structures contained therein are not drawn to scale.

The present methods are described using silicon (Si) nanowires and Si processing. However, the present techniques can also be practiced with other semiconductor materials such as, for example, germanium (Ge) or III-V semiconductors. When non-Si-containing semiconductors are used, the processing steps of the present teachings are basically the same except that growth temperature and dopant species applied are adapted to the specific semiconductor used. Use of Si-containing semiconductor materials such as Si, silicon germanium (SiGe), Si/SiGe, silicon carbide (SiC) or silicon germanium carbide (SiGeC), for example, are however preferred. It is noted that a portion of the nanowires is used herein as the device channel or body.

Figure 1A:
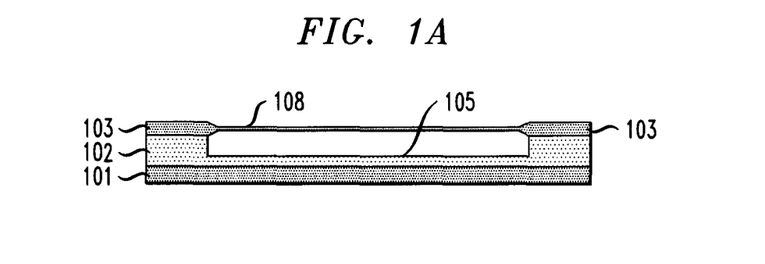
FIG. 1A is a cross-sectional diagram illustrating a starting structure for a field-effect transistor (FET) device fabrication process, i.e., a plurality of nanowires and pads formed in a silicon-on-insulator (SOI) layer, wherein the nanowires have been thinned/reshaped and are suspended over a buried oxide (BOX) according to an embodiment of the present invention.
Figure 1B:
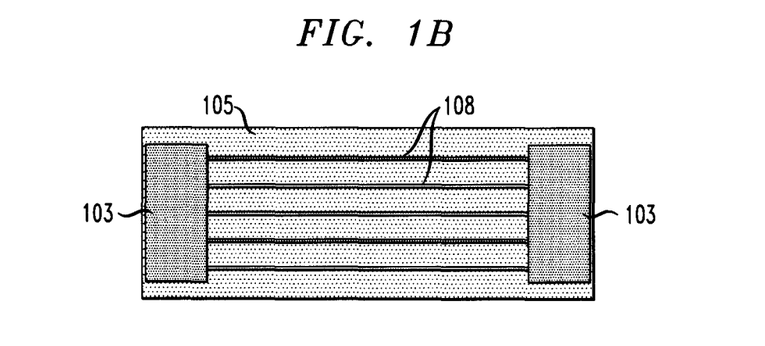
FIG. 1B is a top-down diagram of the structure of FIG. 1A which shows that the nanowires and pads are formed in a ladder-like configuration wherein the nanowires connect the pads like rungs of a ladder according to an embodiment of the present invention.

As shown in FIGS. 1A and 1B, the starting structure for the present fabrication process includes a plurality of nanowires 108 and pads 103 having been patterned in a silicon-on-insulator (SOI) layer of a SOI wafer, for example, using conventional lithography (e.g., optical or e-beam) followed by reactive ion etching (RIE). The SOI wafer includes a buried oxide (BOX) 102 (e.g., silicon dioxide) beneath the SOI layer, which separates the SOI layer from a substrate 101 (e.g., a silicon substrate). As will be described in conjunction with the description of FIG. 1B, below, the nanowires 108 and pads 103 form a ladder-like structure wherein the nanowires 108 connect the pads 103 like the rungs of a ladder.

As shown in FIG. 1A, the nanowires 108 are suspended over the BOX 102. Namely, a portion 105 of the BOX 102 is recessed beneath the nanowires 108. Techniques that may be used to suspend the nanowires 108 by recessing or undercutting a portion 105 of the BOX 102 are described in U.S. Pat. No. 7,884,004 issued to Bangsaruntip et al., entitled "Maskless Process for Suspending and Thinning Nanowires" (hereinafter "U.S. Pat. No. 7,884,004"), the entire contents of which are incorporated by reference herein. For example, in U.S. Pat. No. 7,884,004 it is described that the nanowires can be suspended (released from the BOX) by etching the BOX and recessing the BOX under the nanowires. In this manner, the nanowires 108 form a suspended bridge between the pads 103. As described in U.S. Pat. No. 7,884,004, recessing of the BOX can be achieved with a diluted hydrofluoric (DHF) etch. The DHF etch is isotropic. The lateral component of the etching undercuts the BOX under the narrow nanowires, however the large SOI pads are not released and remain attached to the BOX.

Alternatively, instead of using a DHF etch, the suspension of the nanowires may be obtained during an annealing process configured to re-shape the nanowires which can also cause separation of the nanowire from the BOX. Namely, as described in U.S. Pat. No. 7,884,004, gate length scaling of GAA FETs with nanowire channels can be achieved provided that the nanowire channel diameter can be reduced. In many instances, however, the size of the nanowires needs to be reduced further to dimensions smaller than current lithographic methods can produce.

According to an exemplary embodiment, the techniques described in U.S. Pat. No. 7,884,004 are used to thin/reshape the nanowires 108 as shown in FIG. 1A. By way of example only, U.S. Pat. No. 7,884,004 describes that an annealing process is used to thin and reshape the nanowires wherein the SOI wafer is contacted with an inert gas at a temperature, pressure and for a duration sufficient to cause silicon to migrate from the nanowires to the pads. Suitable inert gasses include any gas that does not react with silicon, e.g., hydrogen ($H_2$), xenon (Xe), helium (He) and potentially others. According to an exemplary embodiment, the inert gas anneal is performed with a gas pressure of from about 30 ton to about 1000 ton, at a temperature of from about 600 degrees Celsius (° C.) to about 1100° C. and for a duration of from about one minute to about 120 minutes.

As highlighted above, instead of using a DHF etch, the suspension of the nanowires may also be obtained during the anneal since the re-shaping of the nanowire cross-section and migration of Si to the SOI pads leads to release/separation of the nanowire from the BOX.

FIG. 1B is a top-down diagram of the structure of FIG. 1A. As shown in FIG. 1B, the nanowires 108 and the pads 103 are formed having a ladder-like configuration wherein the nanowires 108 connect the pads 103 like rungs of a ladder. The anchoring of the nanowires 108 to the pads 103 aids in inducing strain into the nanowires 108, as described in detail below.

As will be described in detail below, the present techniques involve the use of a hydrogen silsesquioxane (HSQ) curing process to induce strain in the nanowires. The HSQ is subsequently removed, but its induced strain is ultimately retained in the nanowires by one or more gates of the device. Two fabrication process examples are presented. In the first example (see FIGS. 2-6), the strain induced in the nanowires that is ultimately retained by the gates is a compressive strain thus being suited for p-channel FET devices. In the second example (see FIGS. 8-12), the strain induced in the nanowires that is ultimately retained by the gates is a tensile strain thus being suited for n-channel FET devices.

Now, by way of reference to FIGS. 2-6, an embodiment will be presented for inducing compressive strain in the nanowire channels. First, HSQ is deposited onto the structure. According to an exemplary embodiment, the HSQ is deposited using a spin-coating process which forms a continuous, planarizing film. Since, as described above, the nanowires 108 are suspended over the BOX 102, the spin-coated HSQ will cover and surround at least a portion of each of the nanowires 108.

Figure 2A:
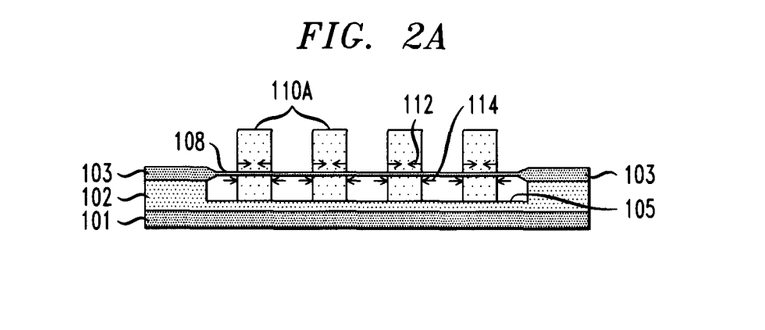
FIG. 2A is a cross-sectional diagram illustrating a hydrogen silsesquioxane (HSQ) layer having been deposited so as to surround the suspended nanowires and the HSQ having been patterned by cross-linking which causes the patterned HSQ to shrink thereby inducing strain in the nanowires according to an embodiment of the present invention.
Figure 2B:
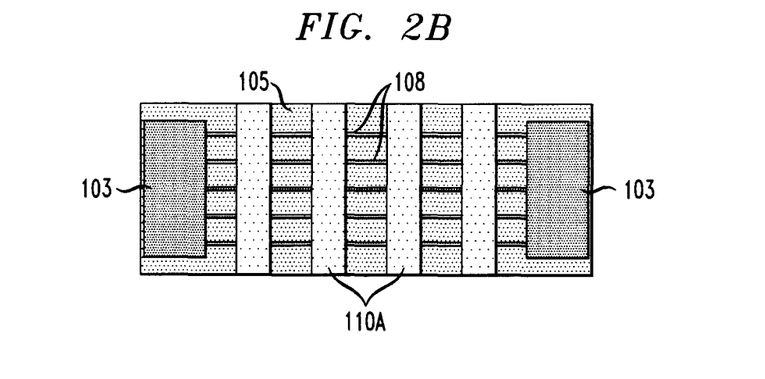
FIG. 2B is a top-down diagram of the structure of FIG. 2A which illustrates the patterned HSQ surrounding the nanowires, wherein the patterned HSQ serves as dummy gates in the fabrication process according to an embodiment of the present invention.

Next, as shown in FIG. 2A, the HSQ is patterned, forming patterned HSQ 110A. FIG. 2B is a top-down view of the structure of FIG. 2A. It is notable that the number of patterned HSQ 110A portions can be varied. The HSQ is patterned by first exposing portions of the spin-coated HSQ layers (i.e., the portions of the HSQ that will remain after the patterning) to an energy-yielding process that will cure and cross-link those portions of the HSQ. It is notable that, as will be described in detail below, during the cross-linking process the HSQ will shrink. This shrinking is what is used in the present techniques to induce strain in the nanowires. According to an exemplary embodiment, the HSQ is cross-linked by exposing the spin-coated HSQ to e-beam or extreme ultraviolet (EUV) radiation with wavelengths shorter than 157 nanometers (nm). This serves to cross-link the HSQ in the exposed areas 110A. Next, unexposed portions of the HSQ (not cross-linked) can then be selectively removed using a developer wash (such as a Tetramethyl-ammonium hydroxide (TMAH) based developer or a salt based developer such as an aqueous mixture of sodium hydroxide (NaOH) alkali and sodium chloride (NaCl) salt) resulting in patterned HSQ 110A. Since cross-linking is used herein to pattern the HSQ, i.e., allowing selective removal of the uncross-linked portions of the HSQ, the term "patterned HSQ" as used herein also implies that these patterned portions of the HSQ are cross-linked. Following the developer wash, the remaining patterned HSQ 110A may be annealed to further increase the density of the HSQ (and thus reduce its volume). The annealing temperature should be kept low enough (below 960° C.) so the HSQ will not reflow and allow the strain in the wires to relax. According to an exemplary embodiment, the anneal is performed at a temperature of from about 500° C. to about 900° C. for a duration of from about 5 minutes to about 30 minutes.

As highlighted above, the cross-linking (and optional anneal) causes the patterned HSQ 110A to shrink (i.e., its volume decreases by from about 5 percent (%) to about 10% as compared to non-cross-linked HSQ). Since the patterned HSQ 110A surrounds the nanowires 108, the result of this shrinking is a strain being induced in the nanowires 108. Namely, a compressive strain (see arrows 112) is induced in those portions of the nanowires 108 surrounded by the patterned HSQ 110A. Further, a tensile strain (see arrows 114) is induced in those portions of the nanowires 108 in between the patterned HSQ 110A. Specifically, by inducing compressive strain in the portions of the nanowires 108 surrounded by the patterned HSQ 110A (i.e., due to the shrinking of the patterned HSQ 110A) and since the nanowires 108 are anchored on their ends to the pads 103, those portions of the nanowires 108 not surrounded by the patterned HSQ 110A are effectively being pulled, thus resulting in tensile strain. See also, FIGS. 7A and 7B, described below. The concept of compressive/tensile strain induced in the nanowires 108 by the present techniques is further described in conjunction with the description of FIG. 13, below.

The amount of strain induced in the nanowires 108 depends on the volume change in the HSQ and also on the diameter of the nanowires. For example, with nanowires having a diameter of about 10 nm and as-deposited 87 nm thick HSQ, a strain of $\Delta L/L=0.7\%$ for a 10% reduction in the HSQ film thickness was measured after exposure.

Figure 3:
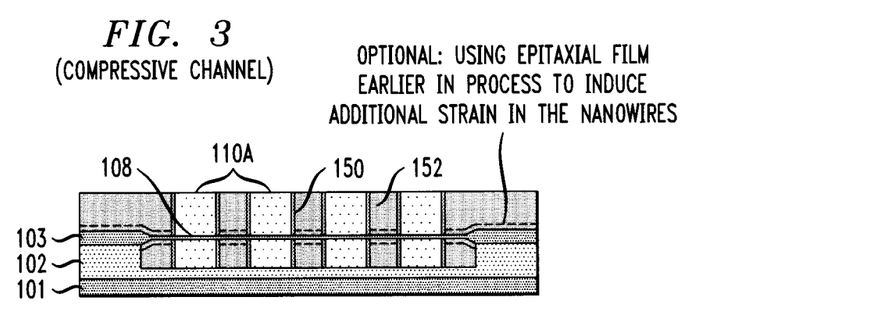
FIG. 3 is a cross-sectional diagram illustrating spacers having been formed adjacent to sidewalls of the patterned HSQ dummy gates and a filler material having been deposited onto the structure, surrounding exposed portions of the nanowires according to an embodiment of the present invention.

In this example, the patterned HSQ 110 will act as a 'dummy gate' or placeholder for replacement gates employed later in the process. As shown in FIG. 3, spacers 150 are formed adjacent to sidewalls of the patterned HSQ 110 'dummy gates'. According to an exemplary embodiment, the spacers 150 comprise an insulating nitride, oxide, oxynitride or multilayers thereof and are formed adjacent to the sidewalls of the patterned HSQ 110 'dummy gates' by deposition and etching. A filler material 152 is then deposited (e.g., using a spin-coating process) onto the structure, filling spaces in between the patterned HSQ 110 'dummy gates' surrounding exposed portions of the nanowires 108 and covering the pads 103. The filler material 152 should 1) be able to hold the strain in the nanowires 108 (in this case the tensile stain induced in the nanowires 108 by the HSQ cross-link as described above); and 2) should be a material that has etch selectivity (i.e., etch resistivity) with respect to the etching process that is later used to remove the HSQ 110A. According to an exemplary embodiment, the filler material is a low-k dielectric (LKD) material available from JSR Corporation™, Sunnyvale, Calif., such as LKD 1037. By holding the tensile strain in the nanowires 108, the filler material 152 allows the dummy gates to be removed and replaced with replacement gates (see below). The replacement gates will then retain the strain (in this case the compressive strain) induced in the nanowires 108, even after the filler material 152 is removed.

Following deposition of the filler material 152, as is known in the art, the filler material is cured or annealed to remove the solvent. By way of example only, when LKD 1037 is used as the filler material 152, then a UV cure at about 400° C. (e.g., from about 350° C. to about 450° C.) in nitrogen for a duration of about 4 minutes (e.g., from about 3.5 minutes to about 5 minutes) may be employed to remove the remaining solvent. Additionally, the filler material 152 may expand during this curing process which, as described immediately below, can be one possible mechanism for introducing additional strain into the nanowires 108.

Namely, in addition to the HSQ inducing strain in the nanowires 108 (as described above), additional strain can be induced in the nanowires 108 through a couple of other mechanisms according to the present techniques. The first technique involves selecting a filler material that upon curing (see above) expands. This expansion will increase the tensile strain in the regions where the filler material 152 surrounds the nanowires 108. When the filler material 152 adds to the tensile strain in the nanowires 108, additional compressive strain will be induced in the regions of the nanowires 108 that are occupied by the patterned HSQ 110A dummy gate following the dummy gate removal (see below, where the dummy gates are removed forming trenches in the filler material 152; it is the portions of the nanowires 108 within the trenches that can experience additional compressive strain from the filler material 152).

Figure 5:
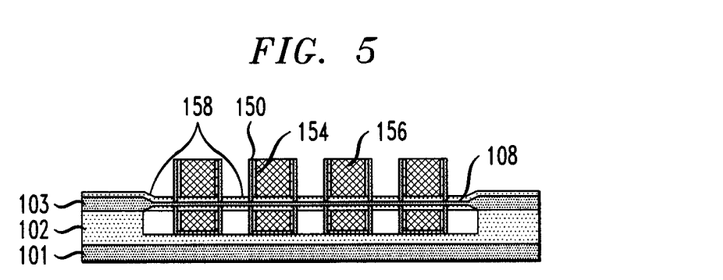
FIG. 5 is a cross-sectional diagram illustrating the filler material having been removed and an epitaxial film having been formed on the nanowires and pads according to an embodiment of the present invention.

As will be described in detail below, an epitaxy step is used to thicken the nanowires 108. FIG. 5 (described below) shows that this epitaxy step can be performed following removal of the filler material 152. Alternatively, this epitaxy step can be performed before the filler material 152 is deposited (and before the spacers 150 are formed) so as to induce additional strain in the nanowires 108. This is the second technique for inducing additional strain in the nanowires. The details of this epitaxy process are described in conjunction with the description of FIG. 5 below and are the same parameters as would be applied here, just earlier in the process. This optional, implementation of an epitaxy step earlier in the process is shown illustrated in FIG. 3 with a dotted line indicating the epitaxial film formed on the nanowires 108 and pads 103. As will be described in detail below, it may be preferable in this case to form an epitaxial film from silicon germanium (SiGe) (rather than for example Si) due to SiGe having a larger lattice constant. The filler material 152 can then be deposited onto the epitaxial film (as shown in FIG. 3). It is notable that if one chooses to perform the epitaxy at this point in the process, then the epitaxy step illustrated in FIG. 5 is not needed. Further, either the first technique (using the filler material to induce additional strain in the nanowires 108) or the second technique (using epitaxy to induce additional strain in the nanowires 108) can be used independently or both in combination to induce additional strain in the nanowires 108.

As highlighted above, the patterned HSQ 110A dummy gates serve as a placeholder for a replacement gate. The formation of a replacement gate is now described. First, the patterned HSQ 110A dummy gates are removed selective to the filler material 152. According to an exemplary embodiment, the patterned HSQ 110A dummy gates are removed selective to the filler material 152 using an etchant, for example, DHF. As highlighted above, one criteria for the selection of the filler material 152 is this etch selectivity vis-à-vis the patterned HSQ. The result is the formation of one or more trenches in the filler material 152 where the patterned HSQ 110A dummy gates were. As also highlighted above, the filler material must also be able to retain the strain in the nanowires 108 once the patterned HSQ 110A dummy gates are removed.

Figure 4:
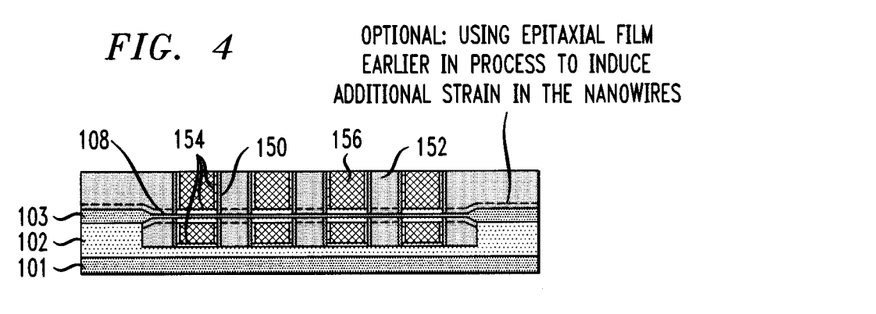
FIG. 4 is a cross-sectional diagram illustrating the patterned HSQ dummy gates having been replaced with a gate conductor to form replacement gates according to an embodiment of the present invention.

Next, the portions of the nanowires 108 exposed by removal of the patterned HSQ 110 dummy gates are coated with a gate dielectric 154. The gate dielectric 154 can comprise silicon dioxide (SiO$_2$), silicon oxynitride (SiON), hafnium oxide (HfO$_2$) or any other suitable high-k dielectric(s) and may be deposited around (so as to surround) the nanowires 108 using chemical vapor deposition (CVD), atomic layer deposition (ALD) or an oxidation furnace in the case of Si)$_2$ and SiON. As shown in FIG. 4, this gate dielectric formation process results in the deposition of gate dielectric material surrounding the nanowires 108, and also lining the trenches (i.e., on the spacers 150 and on the exposed BOX 102).

Next, as shown in FIG. 4, the trenches are filled with a gate conductor 156. This gate conductor 156 constitutes a replacement gate of the device. See above. Suitable gate conductors include, but are not limited to, polysilicon, a metal (such as a tantalum nitride (TaN), titanium nitride (TiN), tungsten (W), or aluminum (Al)) or a combination of metals (such as TiN/Al)). Polysilicon may be deposited using a CVD process, such as low-pressure CVD (LPCVD) or plasma-enhanced CVD (PECVD). Metal gate conductors may be deposited using a physical vapor deposition (PVD), ALD or an electroplating process. If so desired, any excess gate conductor material may be removed using chemical mechanical polishing (CMP) or other suitable etching technique. The replacement gates formed in this manner will surround the nanowires, making this a GAA device.

As with FIG. 3, the optional epitaxial film which may be employed early in the process to induce additional strain in the nanowires 108 is shown in FIG. 4. If, however, the epitaxy step is not carried out until the filler material 152 is removed (as in the example shown illustrated in FIG. 5), then this film would not yet be present.

The filler material 152 is then removed. See FIG. 5. According to an exemplary embodiment, the filler material is removed selective to the gate conductor 156 using reactive ion etching (RIE) or a wet etch.

As also shown in FIG. 5, an epitaxial film 158 is used to thicken portions of the nanowires 108 not covered by the gate conductor 156/spacers 150 (i.e., the source and drain regions of the device). The epitaxy also takes place over exposed portions of the pads 103 (see FIG. 5). The resulting epitaxial film 158 can be of Si or a Si alloy such as SiGe. Growth methods can include ultra-high vacuum chemical vapor deposition (UHV-CVD), rapid thermal chemical vapor deposition (RT-CVD) and ALD. Typical Si precursors include, but are not limited to, dichlorosilane (SiH$_2$Cl$_2$), a mixture of silane (SiH$_4$) and hydrochloric acid (HCl), silicon tetrachloride (SiCl$_4$) and germane (GeH$_4$) for SiGe growth. The growth is selective in the sense that deposition of Si takes place only over Si surfaces, but not over dielectric surfaces such as oxides and silicon-nitrides. While selective Si epitaxy typically requires growth temperatures of about 800° C., maintaining selectivity when using lower growth temperatures is possible by adding Ge to the epitaxial film. With pure Ge growth, the growth temperature can be as low as 300° C. Low temperature growth of SiGe is useful in the case of very thin nanowires as a way to circumvent agglomeration. As highlighted above, this epitaxy step can instead be performed prior to deposition of the filler material 152 as a way to induce additional strain in the nanowires 108. In that case, it is preferable that epitaxial film 158 is formed from SiGe. Namely, SiGe has a larger lattice constant than Si. When SiGe is epitaxially grown on Si it will have compressive strain and it will induce tensile strain in the (e.g., Si) nanowires as the SiGe film tries to elastically relax. From this point forward in the process, the epitaxial film would appear the same whether it is formed before or after the filler material.

It is notable that the portions of the nanowires 108 surrounded by the replacements gates (i.e., gate conductor 156) will serve as channels of the device. The pads 103 and portions of the nanowires 108 extending out from the replacement gates (including those portions of the nanowires 108 in between the replacement gates) will serve as source and drain regions of the device. Thus, in the exemplary embodiment shown illustrated in FIG. 5, the epitaxial film 158 is formed on the source and drain regions.

Final processing is then performed to complete the device. According to the exemplary embodiment shown in FIG. 6, a self-aligned silicide 160 is formed over the epitaxial film 158. More specifically, a silicide forming metal such as nickel (Ni), platinum (Pt), cobalt (Co) and/or titanium (Ti) is blanket deposited over the device using, for example, ALD or PVD. The assembly is annealed to allow the metal to react with the exposed Si, Ge or SiGe of the epitaxial film 158. The metal over non-Si, -Ge or -SiGe surfaces remains unreacted. A selective etch is then used to remove the unreacted metal, leaving the silicide 160. As an example, in the case where Ni is used, the lower resistivity silicide phase is nickel-silicon (NiSi). The NiSi phase forms at an annealing temperature of about 420° C., and the etch chemistry used to remove the unreacted metal is hydrogen peroxide:sulfuric acid (H$_2$O$_2$:H$_2$SO$_4$) 10:1 at 65° C. for 10 minutes. When conformal deposition methods such as ALD are used to deposit the silicide forming metal, uniform silicide will surround the epitaxial film 158. Other deposition techniques such as PVD may yield a less uniform coverage of the metal which will result in thinner silicide over sidewalls and under the nanowires 108.

Next a conformal oxide layer that will serve as a first CMP stop layer 162 is deposited over the structure (i.e., over the silicide 160 and the gate conductor 156). According to an exemplary embodiment, the first CMP stop layer is deposited over the structure using CVD to a thickness of from about 10 nm to about 100 nm. A layer of planarizing dielectric 164 is then deposited over the structure. According to an exemplary embodiment, the planarizing dielectric 164 is an organic planarizing material which is spin-coated onto the structure. Suitable organic planarizing materials contain an aromatic cross-linkable polymer (e.g., naphthalene-based) in a solvent. Spin-coating ensures that the organic planarizing material sufficiently fills all of the gaps. When possible, the organic planarizing material should fill under the nanowires (as is the case in the example shown in FIG. 6). A post-apply bake may then be performed to cross-link the organic planarizing material and bake off the solvent. According to an exemplary embodiment, the post-apply bake is conducted at a temperature of up to about 250 degrees Celsius (° C.), e.g., from about 200° C. to about 250° C.

Figure 6:
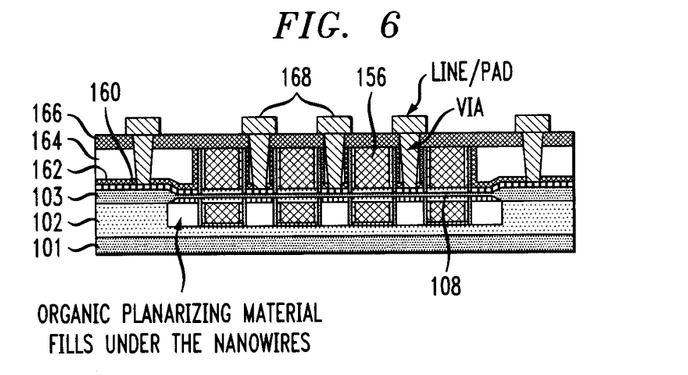
FIG. 6 is a cross-sectional diagram illustrating final processing steps being performed to complete the device, including forming form source/drain contacts according to an embodiment of the present invention.

The planarizing dielectric 164 is then polished using (e.g., CMP) with the first CMP stop layer 162 acting as an etch stop. In order to sufficiently serve as an etch stop, the first CMP stop layer 162 has to have a polish rate that is substantially smaller than that of the planarizing dielectric 164.

A second CMP stop layer 166 is then deposited on the polished planarizing dielectric 164/replacement gates. According to an exemplary embodiment, the second CMP stop layer is formed from a nitride material (e.g., silicon nitride) and is deposited onto the structure to a thickness of from about 10 nm to about 100 nm.

Contacts are then formed to the source and drain regions of the device (i.e., source/drain contacts 168). According to an exemplary embodiment, standard lithography processes are used to form trenches that extend through the second CMP stop layer 166, the planarizing dielectric 164 and the first CMP stop layer 162. This may be accomplished using a series of reactive ion etching (RIE) steps, as is known in the art. The trenches may then be filled with a metal or metals to form the source/drain contacts 168. Suitable metals include, but are not limited to, tungsten (W) and copper (Cu). According to an exemplary embodiment, the source/drain contacts are formed by filling the trenches with the metal or metals and then polishing the excess metal that fills the trenches. This polishing can be done using CMP, with the second CMP stop layer 166 acting as an etch stop. The result is the formation of conductive vias in the trenches. Next, metal pads and/or lines can be formed in contact with the conductive vias. These pads/lines may be formed from the same metal or combination of metals as the vias using, for example, a RIE patterning process can be used to define the metal pads and/or lines.

Figure 7A:
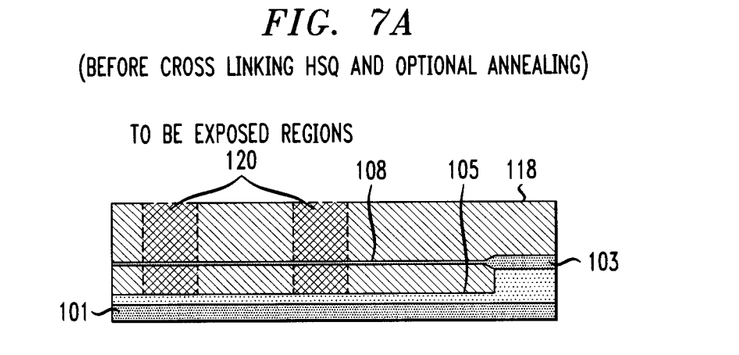
FIG. 7A is a cross-sectional diagram illustrating an HSQ layer surrounding suspended nanowires prior to cross-linking and annealing according to an embodiment of the present invention.
Figure 7B:
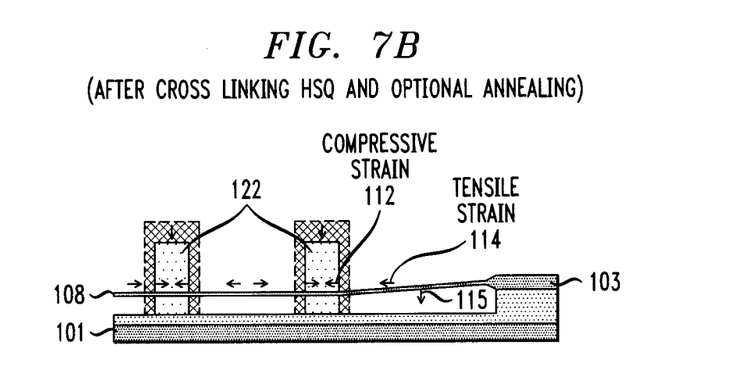
FIG. 7B is a cross-sectional diagram illustrating the strain induced in the nanowires of FIG. 7A after the HSQ has been cross-linked and annealed according to an embodiment of the present invention.

FIGS. 7A and 7B are now presented to further illustrate how the patterning of HSQ dummy gates induces strain in the nanowires channels. For clarity and consistency of description, the same reference numerals from FIGS. 1-6 are used in FIGS. 7A and 7B and thus are intended to refer to the same structures. As shown in FIG. 7A, a spin-coated HSQ layer 118 covers/surrounds the nanowires 108. The regions of the HSQ to be exposed 120 (e.g., to e-beam or EUV radiation so as to become cross-linked) are indicated with cross-hatching. As shown in FIG. 7B, after cross-linking, and removal of the unexposed portions of the spin-coated HSQ 118, what remains are cross-linked HSQ 122 portions. Cross-linked HSQ 112 is the same as the patterned HSQ dummy gates in the embodiment described above. The cross-hatching from FIG. 7A is transposed onto FIG. 7B to illustrate that the HSQ upon cross-linking shrinks thereby inducing compressive strain (see arrows 112) and tensile strain (see arrows 114) in the nanowires 108. Further, as shown in FIG. 7B, since the cross-linked HSQ will shrink in from all directions, the nanowires 108 may be pulled closer to the recessed oxide 105 (see arrow 115) which further contributes to the tensile strain at the ends of the nanowires 108 (i.e., since the nanowires 108 are attached at each end to the pads 103. The concept of compressive/tensile strain induced in the nanowires 108 by the present techniques is further described in conjunction with the description of FIG. 13, below.

An alternative embodiment employing the present strain inducing techniques will now be presented by way of reference to FIGS. 8-12. In this case, the present techniques will be used to induce tensile strain in the nanowires channels. The starting structure for this example is the same as that shown in FIGS. 1A and 1B (i.e., having nanowires 108 and pads 103, wherein a buried oxide 102 is undercut beneath the nanowires 108). Thus, following from FIGS. 1A and 1B, an HSQ layer is first deposited (e.g., spin-coated) onto the structure. Since, as described above, the nanowires 108 are suspended over the BOX 102, the spin-coated HSQ will cover and surround a portion of each of the nanowires 108. See FIG. 8.

Figure 8:
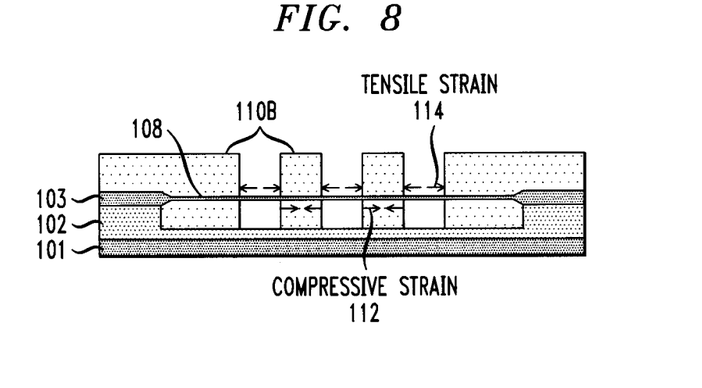
FIG. 8 is a cross-sectional diagram illustrating in an alternative process (following from FIG. 1A) an HSQ layer having been deposited so as to surround the suspended nanowires and the HSQ having been patterned by cross-linking which causes the patterned HSQ to shrink thereby inducing strain in the nanowires according to an embodiment of the present invention.

As described above, the HSQ is then patterned. However, by comparison with the compressive strain embodiment presented above wherein the patterned HSQ served as dummy gates and thus marked the locations of the gates of the device, in this case patterned HSQ 110A will mark the locations of the source/drain regions of the device, rather than the gates. Namely, the HSQ will be removed from areas in which the gates of the device will be formed.

The HSQ is patterned by first exposing portions of the spin-coated HSQ layers (i.e., the portions of the HSQ that will remain after the patterning) to an energy-yielding process that will cure and cross-link those portions of the HSQ. As described above, during the cross-linking process the HSQ will shrink, thereby inducing strain in the nanowires 108. According to an exemplary embodiment, the spin-coated HSQ is cross-linked by exposing the HSQ to e-beam or EUV radiation with wavelengths shorter than 157 nm. This serves to cross-link the HSQ in the exposed areas. Next, unexposed portions of the HSQ can then be selectively removed using a developer (e.g., a TMAH based developer or an aqueous mixture of NaOH alkali and NaCl salt), resulting in patterned HSQ 110B. Following the developer wash, the remaining patterned HSQ 110B may be annealed to further increase the density of the HSQ (and thus reduce its volume). The annealing temperature should be kept low enough (below 960° C.) so the HSQ will not reflow and allow the strain in the wires to relax. According to an exemplary embodiment, the anneal is performed at a temperature of from about 500° C. to about 900° C. for a duration of from about 5 minutes to about 30 minutes.

As described above, the cross-linking causes the patterned HSQ 110B to shrink (i.e., its volume decreases by from about 5% to about 10% as compared to non-cross-linked HSQ). Since the patterned HSQ 110B surrounds the nanowires 108, the result of this shrinking is a strain being induced in the nanowires 108. Namely, a compressive strain (see arrows 112) is induced in those portions of the nanowires 108 surrounded by the patterned HSQ 110B. Further, a tensile strain (see arrows 114) is induced in those portions of the nanowires 108 in between the patterned HSQ 110B. Specifically, by inducing compressive strain in the portions of the nanowires 108 surrounded by the patterned HSQ 110B (i.e., due to the shrinking of the patterned HSQ 110B) and since the nanowires 108 are anchored on their ends to the pads 103, those portions of the nanowires 108 not surrounded by the patterned HSQ 110B are effectively being pulled, thus resulting in tensile strain. The concept of compressive/tensile strain induced in the nanowires 108 by the present techniques is further described in conjunction with the description of FIG. 13, below.

Figure 9:
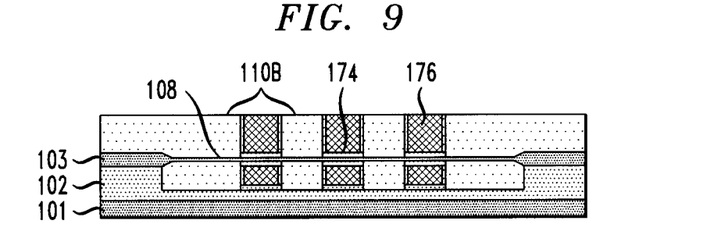
FIG. 9 is a cross-sectional diagram illustrating trenches in the patterned HSQ having been filled with a gate conductor to form gates of the device according to an embodiment of the present invention.

As shown in FIG. 8, by patterning the HSQ, one or more trenches are formed in between the patterned HSQ 110B portions. In this example, gates of the device will be formed in these trenches. First, however, exposed portions of the nanowires 108 (i.e., within the trenches) are coated with a gate dielectric 174. The gate dielectric 174 can include $SiO_2$, SiON, $HfO_2$ or any other suitable high-k dielectric(s) and may be deposited around (so as to surround) the nanowires 108 using CVD, ALD or an oxidation furnace in the case of $SiO_2$ and SiON. As shown in FIG. 9, this gate dielectric formation process results in the deposition of the gate dielectric material around the nanowires 108, and also lining the trenches including the exposed BOX 102.

Next, as shown in FIG. 9, the trenches are filled with a gate conductor 176 so as to form the gates of the device. Suitable gate conductors include, but are not limited to, polysilicon, a metal (such as a W, TiN, TaN, or aluminum) or a combination of metals (such as TiN/Al). Polysilicon may be deposited using a CVD process, such as low-pressure CVD (LPCVD) or plasma-enhanced CVD (PECVD). Metal gate conductors may be deposited using ALD, CVD or an electroplating process. If so desired, any excess gate conductor may be removed using chemical mechanical polishing (CMP) or other suitable etching technique. The gates as now formed serve to retain the tensile strain induced in the nanowires 108 (see FIG. 8) even when the patterned HSQ 110B is next removed. The gates formed in this manner will surround the nanowires, making this a GAA device.

Figure 10:
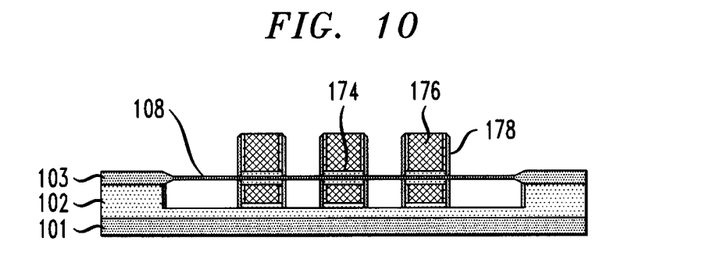
FIG. 10 is a cross-sectional diagram illustrating the patterned HSQ having been removed selective to the gate conductor followed by spacer formation according to an embodiment of the present invention.

The patterned HSQ 110B is then removed. See FIG. 10. According to an exemplary embodiment, the patterned HSQ 110B is removed selective to the gate conductor 176 using an etchant, e.g., DHF. As shown in FIG. 10, spacers 178 are formed adjacent to sidewalls of the gates. According to an exemplary embodiment, the spacers 178 are made up of an insulating nitride, oxide, oxynitride or multilayers thereof and are formed adjacent to the sidewalls of the gates by deposition and etching.

Figure 11:
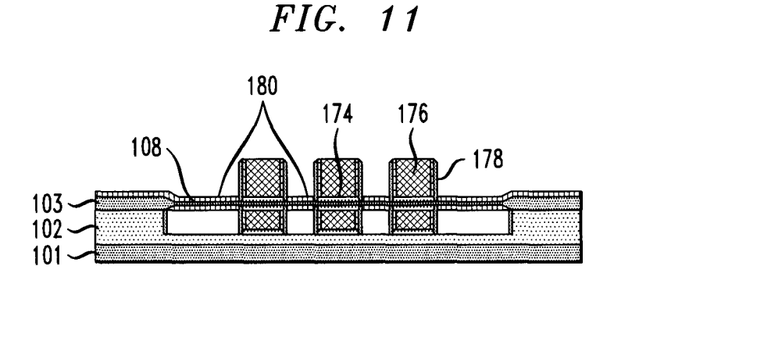
FIG. 11 is a cross-sectional diagram illustrating an epitaxial film having been formed on the nanowires and pads according to an embodiment of the present invention.

Next, as shown in FIG. 11, an epitaxial film 180 is used to thicken portions of the nanowires 108 not covered by the gate conductor 176/spacers 178 (i.e., the source and drain regions of the device). The epitaxy also takes place over exposed portions of the pads 103 (see FIG. 11). The resulting epitaxial film 180 can be of Si or a Si alloy such as SiGe. Growth methods can include UHV-CVD, RT-CVD and ALD. Typical Si precursors include, but are not limited to, dichlorosilane ($SiH_2Cl_2$), a mixture of silane ($SiH_4$) and hydrochloric acid (HCl), silicon tetrachloride ($SiCl_4$) and germane ($GeH_4$) for SiGe growth. The growth is selective in the sense that deposition of Si takes place only over Si surfaces, but not over dielectric surfaces such as oxides and silicon-nitrides. While selective Si epitaxy typically requires growth temperatures of about 800° C., maintaining selectivity when using lower growth temperatures is possible by adding Ge to the epitaxial film. With pure Ge growth, the growth temperature can be as low as 300° C. Low temperature growth of SiGe is useful in the case of very thin nanowires as a way to circumvent agglomeration.

It is notable that the portions of the nanowires 108 surrounded by the gates (i.e., gate conductor 176) will serve as channels of the device. The pads 103 and portions of the nanowires 108 extending out from the gates (including those portions of the nanowires 108 in between the gates) will serve as source and drain regions of the device. Thus, in the exemplary embodiment shown illustrated in FIG. 11, the epitaxial film 180 is formed on the source and drain regions.

Final processing is then performed to complete the device. According to the exemplary embodiment shown in FIG. 12, a self-aligned silicide 182 is formed over the epitaxial film 180. More specifically, a metal(s) such as Ni, Pt, Co and/or Ti is blanket deposited over the device. The assembly is annealed to allow the metal to react with the exposed Si, Ge or SiGe of the epitaxial film 180. The metal over non-Si, -Ge or -SiGe surfaces remains unreacted. A selective etch is then used to remove the unreacted metal, leaving the silicide 182. As an example, in the case where Ni is used, the lower resistivity silicide phase is nickel-silicon (NiSi). The NiSi phase forms at an annealing temperature of about 420° C., and the etch chemistry used to remove the unreacted metal is hydrogen peroxide:sulfuric acid ($H_2O_2$:$H_2SO_4$) 10:1 at 65° C. for 10 minutes.

Next a conformal oxide layer that will serve as a first CMP stop layer 184 is deposited over the structure (i.e., over the silicide 182 and the gate conductor 176). According to an exemplary embodiment, the first CMP stop layer 184 is deposited over the structure using CVD to a thickness of from about 10 nm to about 100 nm. A layer of planarizing dielectric 186 is then deposited over the structure. According to an exemplary embodiment, the planarizing dielectric 186 is an organic planarizing material which is spin-coated onto the structure. Suitable organic planarizing materials contain an aromatic cross-linkable polymer (e.g., naphthalene-based) in a solvent. Spin-coating ensures that the organic planarizing material sufficiently fills all of the gaps. When possible, the organic planarizing material should fill under the nanowires (as is the case in the example shown in FIG. 12). A post-apply bake may then be performed to cross-link the organic planarizing material and bake off the solvent. According to an exemplary embodiment, the post-apply bake is conducted at a temperature of up to about 250 degrees Celsius (° C.), e.g., from about 200° C. to about 250° C.

Figure 12:
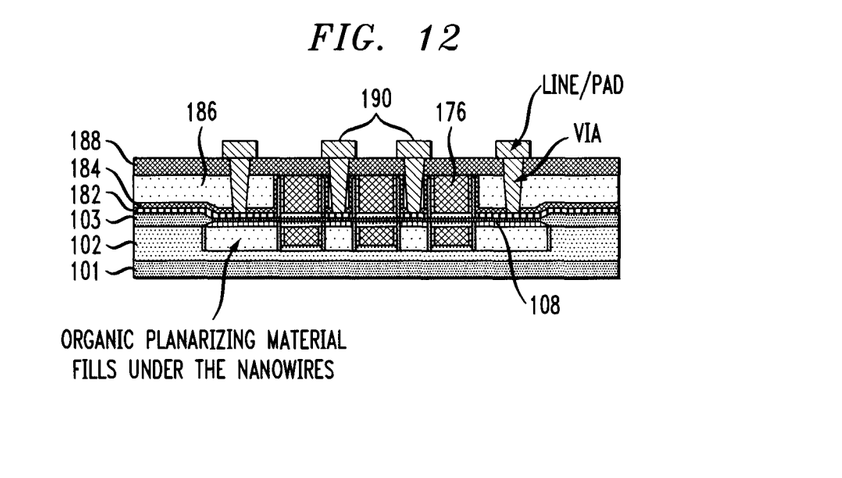
FIG. 12 is a cross-sectional diagram illustrating final processing steps being performed to complete the device, including forming form source/drain contacts according to an embodiment of the present invention.

The planarizing dielectric 186 is then polished using (e.g., CMP) with the first CMP stop layer 184 acting as an etch stop. In order to sufficiently serve as an etch stop, the first CMP stop layer 184 has to have a polish rate that is substantially smaller than that of the planarizing dielectric 186.

A second CMP stop layer 188 is then deposited on the polished planarizing dielectric 186/gates. According to an exemplary embodiment, the second CMP stop layer 188 is formed from a nitride material (such as silicon nitride) and is deposited onto the structure to a thickness of from about 10 nm to about 100 nm.

Contacts are then formed to the source and drain regions of the device (i.e., source/drain contacts 190). According to an exemplary embodiment, standard lithography processes are used to form trenches that extend through the second CMP stop layer 188, the planarizing dielectric 186 and the first CMP stop layer 184. This may be accomplished using a series of RIE steps, as is known in the art. The trenches may then be filled with a metal or metals to form the source/drain contacts 190. Suitable metals include, but are not limited to, W and Cu. According to an exemplary embodiment, the source/drain contacts are formed by filling the trenches with the metal or metals and then polishing the excess metal that fills the trenches. This polishing can be done using CMP, with the second CMP stop layer 188 acting as an etch stop. The result is the formation of conductive vias in the trenches. Next, metal pads and/or lines can be formed in contact with the conductive vias. These pads/lines may be formed from the same metal or combination of metals as the vias using, for example, a RIE patterning process can be used to define the metal pads and/or lines.

Figure 13:
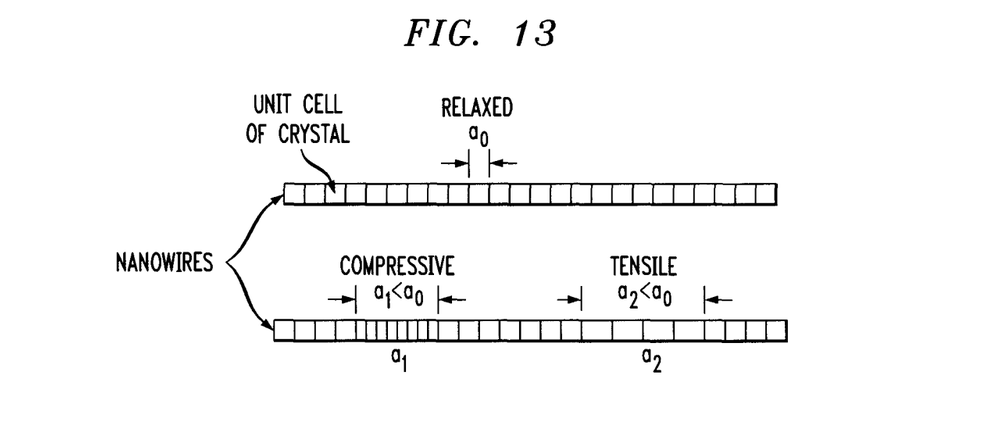
FIG. 13 is a diagram illustrating compressive and tensile strain induced in a nanowire as compared to a nanowire in an unstrained or relaxed state according to an embodiment of the present invention.

FIG. 13 is a diagram illustrating, at a microscopic structural level, compressive and tensile strain induced in a nanowire as compared to a nanowire in an unstrained or relaxed state. Specifically, FIG. 13 shows a first nanowire (the top nanowires shown in the figure) which is in a relaxed state, and a second nanowire (the bottom nanowire shown in the figure) that has both compressive and tensile strain being induced therein. Each of these nanowires shown in FIG. 13 is representative of any of the semiconductor nanowires (e.g., nanowires 108) present in the above-described fabrication processes. As highlighted above, through use of the present HSQ strain inducing processes, tensile and/or compressive strain can be advantageously induced in the nanowires. FIG. 13 further illustrates this process.

Strain by definition has a microscopic structural meaning. When a semiconductor crystal structure (such as is present in semiconductor nanowires 108) is strained it means that the lattice constant "a" of the crystal (at least in one axis or more) has changed from the relaxed size (unstrained value) to another size. The strain value is defined as $\Delta\alpha/\alpha$, where "a" is the relaxed lattice constant and $\Delta\alpha$ is expansion or contraction of the lattice constant. In other words, the amount of strain corresponds to the amount of elastic deformation in the semiconductor crystal structure. It is noted that when the lattice constant is deformed in one axis, there will also be a deformation of the lattice constant in the other two axes as described by the Possion ratio (see, for example, James M. Gere, Mechanics of Materials, $6^{th}$ Ed., pgs. 24-25 (2004), the contents of which are incorporated by reference herein). The deformation or change in the lattice constant can be measured by methods such as x-ray diffraction, or Raman spectroscopy.

Referring to the present device structures, the nanowires (e.g., nanowires 108) are made of a semiconductor crystal (for example silicon). There are several gates formed over the nanowires. As described above, in some portions of the nanowires there is tensile strain and in other portions there is compressive strain (see for example FIGS. 7B, 2A and 8, described above). The lattice constant in the nanowire is therefore deformed such that there are region capped by a gate where the lattice constant is smaller than that of the relaxed silicon lattice constant and/or there are other regions capped by a gate where the lattice constant is larger than that of relaxed silicon. For longitudinal tensile strain the lattice constant will be larger (parallel to the length of the nanowire) since the nanowire is stretched. For longitudinal compressive strain the lattice constant will be smaller (parallel to the length of the nanowire) since the nanowire is contracted. These strain scenarios are shown illustrated in FIG. 13. Namely, in FIG. 13, the unit cells of the crystals are depicted schematically as boxes within the nanowires. Of course, there may be many more cells (and in different arrangements) than those depicted, but what is shown in FIG. 13 is meant merely to illustrate the different strain scenarios at a microscopic, crystal structure level.

As shown in FIG. 13, the nanowires (e.g., nanowires 108) in the relaxed state (relaxed lattice constant $a_0$) have a repeating crystal unit structure. Due to compressive strain (by way of the HSQ strain-inducing processes described above) the nanowires become deformed as compared to the relaxed state, i.e., the compressed strain lattice constant $a_1 < a_0$. This is illustrated in FIG. 13 by the unit cells in the compressive strain region of the nanowires being smaller (parallel to the length of the nanowire). By comparison, due to tensile strain (by way of the HSQ strain-inducing processes described above) the nanowires become deformed as compared to the relaxed state, i.e., the tensile strain lattice constant $a_2 > a_0$. This is illustrated in FIG. 13 by the unit cells in the tensile strain region of the nanowires being larger (parallel to the length of the nanowire).

With the present techniques, depending on the gate configuration/strain-inducing process employed any combination of regions of compressive strain, regions of tensile strain and/or relaxed regions (see above) can be achieved in any given one of the nanowires. Thus, by way of example only, based on the process outlined in FIGS. 1-6, each of the nanowires 108 will have a plurality of first regions that are deformed such that the semiconductor lattice constant in those regions is smaller (less) than that of the relaxed semiconductor lattice constant (i.e., $a_1 < a_0$), which is due, in this example, to the compressive strain induced in the nanowires by the HSQ dummy gate/replacement gate process (see for example arrows 112 in FIG. 2A indicated compressive strain in those first regions of the nanowires 108). The gate conductor 156 (i.e., the replacement gates of the device) surround these regions of the nanowires 108 (see for example FIG. 5). As described above, the HSQ strain-inducing process will also result in regions of tensile strain being induced in the nanowires 108 (see, for example, FIG. 2A). Thus, each of the nanowires will also have a plurality of second regions that are deformed such that the semiconductor lattice constant in those regions is larger (greater) than that of the relaxed semiconductor lattice constant (i.e., $a_2 > a_0$).

Similarly, by way of reference to the process outlined in FIGS. 8-12, each of the nanowires 108 will have a plurality of first regions that are deformed such that the semiconductor lattice constant in those regions is smaller (less) than that of the relaxed semiconductor lattice constant (i.e., $a_1 < a_0$), which is due, in this example, to the compressive strain induced in the nanowires by the HSQ dummy gate/replacement gate process (see for example arrows 112 in FIG. 8 indicating compressive strain in those first regions of the nanowires 108). As described above, the HSQ strain-inducing process will also result in regions of tensile strain being induced in the nanowires 108 (see, for example, FIG. 8). Thus, each of the nanowires will also have a plurality of second regions that are deformed such that the semiconductor lattice constant in those regions is larger (greater) than that of the relaxed semiconductor lattice constant (i.e., $a_2 > a_0$). The gate conductor 176 (i.e., the replacement gates of the device) surrounds these regions of the nanowires 108 (see for example FIG. 10). Thus, a difference between the embodiment of FIGS. 1-6 and that of FIGS. 8-12 is whether the replacement gate in the completed device surrounds the regions of the nanowires with induced compressive strain (FIGS. 1-6) or tensile strain (FIGS. 8-12).

It is notable that with the above-described configuration wherein the nanowires have regions of compressive/tensile strain and/or relaxed regions, that the strain is not necessarily constant for every unit cell of the crystal. Namely, in the transition from a region of strain to a relaxed region, the maximum strain is experienced in the center of the given strained region, and the level of strain drops moving out (parallel to the length of the nanowires) towards the relaxed regions. Thus, the strain profile resulting from the present techniques (i.e., by inducing strain in one or more portions along the length of the nanowires) is different from instances where strain is induced from the ends of the nanowires. In the latter case, the maximum strain would be present at the ends of the nanowires.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A FET device, comprising:
   nanowires and pads formed in a SOI layer over a BOX layer, wherein the nanowires are connected to the pads in a ladder-like configuration, and wherein the nanowires are suspended over the BOX; and
   one or more gates surrounding portions of each of the nanowires, wherein the portions of the nanowires surrounded by the gates comprise channel regions of the device and portions of the nanowires extending out from the gates and the pads comprise source and drain regions of the device,
   wherein each of the nanowires has 1) at least one first region that is deformed such that a lattice constant in the at least one first region is less than a relaxed lattice constant of the nanowires and 2) at least one second region that is deformed such that a lattice constant in the at least one second region is greater than the relaxed lattice constant of the nanowires, and wherein the one or more gates surround the at least one second region of each of the nanowires.

2. The FET device of claim 1, further comprising a gate dielectric surrounding the portions of the nanowires that comprise the channel regions of the device such that the gate dielectric separates the gates from the nanowires in the channel regions of the device.

3. The FET device of claim 2, wherein the gate dielectric comprises silicon dioxide ($SiO_2$), silicon oxynitride (SiON) or hafnium oxide ($HfO_2$).

4. The FET device of claim 1, wherein the gate comprise polysilicon, a metal or a combination of metals.

5. The FET device of claim 1, further comprising spacers adjacent to sidewalls of the gates.

6. The FET device of claim 1, further comprising contacts to the source and drain regions of the device.

7. The FET device of claim 6, wherein the contacts comprise tungsten (W) or copper (Cu).

8. The FET device of claim 1, wherein the at least one first region in each of the nanowires is deformed due to longitudinal compressive strain parallel to a length of the nanowires.

9. The FET device of claim 1, wherein the at least one second region in each of the nanowires is deformed due to longitudinal tensile strain parallel to a length of the nanowires.

10. The FET device of claim 1, wherein the nanowires, when in a relaxed state, have a repeating crystal unit structure.

11. The FET device of claim 1, wherein the at least one first region of each of the nanowires, which is outside of the one or more gates, is deformed such that the lattice constant in the at least one first region is less than the relaxed lattice constant of the nanowires.

* * * * *